(12) United States Patent
Chung

(10) Patent No.: US 7,030,717 B2
(45) Date of Patent: Apr. 18, 2006

(54) IMPEDANCE-MATCHING WAVE FILTER

(75) Inventor: Shun-Ho Chung, Yung Kang (TW)

(73) Assignee: Soontai Tech Co., Ltd, Tainan (TW)

( * ) Notice: Subject to any disclaimer, the term of this patent is extended or adjusted under 35 U.S.C. 154(b) by 35 days.

(21) Appl. No.: 10/848,108

(22) Filed: May 19, 2004

(65) Prior Publication Data
US 2005/0258918 A1 Nov. 24, 2005

(51) Int. Cl.
H03H 7/01 (2006.01)
H03H 7/38 (2006.01)

(52) U.S. Cl. .................... 333/170; 333/172; 333/32

(58) Field of Classification Search .............. 333/32, 333/124, 126, 167, 170–172, 174, 175

See application file for complete search history.

(56) References Cited

U.S. PATENT DOCUMENTS

| 5,379,008 | A | * | 1/1995 | Bockelman et al. | 333/174 |
| 5,541,558 | A | * | 7/1996 | Weber et al. | 333/174 |
| 5,883,553 | A | * | 3/1999 | Tsumura | 333/174 |
| 5,969,582 | A | * | 10/1999 | Boesch et al. | 333/129 |
| 6,426,683 | B1 | * | 7/2002 | Gu et al. | 333/174 |
| 6,895,089 | B1 | * | 5/2005 | Wang | 379/387.01 |
| 2002/0067226 | A1 | * | 6/2002 | Iguchi | 333/174 |

FOREIGN PATENT DOCUMENTS

CA 2306529 A1 * 10/2000

* cited by examiner

Primary Examiner—Seungsook Ham
(74) Attorney, Agent, or Firm—Rosenberg, Klein & Lee

(57) ABSTRACT

An impedance matching wave filter includes an original wave filter and a match circuit. The match circuit is connected in parallel with the original wave filter and is able to be varied to produce impedance matching with the original wave filter in order to improve the condition of the return loss and to lower signal fading and signal distortion.

3 Claims, 6 Drawing Sheets

IMPEDANCE-MATCHING WAVE FILTER

BACKGROUND OF THE INVENTION

1. Field of the Invention

This invention relates to an impedance-matching wave filter, particularly to one having an original filter connected in parallel with a match circuit, which can be modulated to produce impedance matching with the original filter to better the condition of return loss and lower the phenomenon of signal fading and signal distortion.

2. Description of the Prior Art

A conventional signal distributor 1, as shown in FIG. 6, has two or more output ports respectively connected with an input port for receiving signals input through the input port. An amplifier could serve as the signal distributor 1 to receive input signals and then amplify and output them.

Generally, the conventional signal distributor 1 has one of the two output ports connected with a filter 2 for filtering unnecessary signals to attain clear signals. However, after one of the two output ports of the signal distributor 1 is connected with the filter 2, the impedances of the signal distributor 1 and the filter 2 cannot be matched with each other, and hence the other output port of the signal distributor 1 can hardly attain clear signals, always resulting in signal fading and signal distortion.

To detect the filtering effect of the filter 2, a RF network analyzer is employed for detecting the degree of the evenness and the condition of the return loss of the pass band of the output terminal of the filter 2. If the degree of the evenness of the pass band of the output terminal is excellent and the return loss is below −18 db, it shows that the filtering effect of the filter 2 is excellent.

FIG. 7 is a waveform diagram showing the degree of the evenness and the condition of the return loss of the pass band of a conventional high pass filter 2, which are detected by the RF network analyzer. In this waveform diagram, Measure 1 (signal 1) is the output waveform of the filter 2, and Measure 2 (signal 2) is the waveform of the return loss. Viewed from Measure 1, it is obvious that the stop wave band of the signal is positioned below mark 4 (Δ4), that is, the wave-band frequency is below 65 MHz. In comparison with Measure 1, the waveform of the return loss of Measure 2, corresponding to the stop wave band of the signal, is from mark 1 to 4 (Δ1~Δ4), showing that the return loss is 0.117~0.794 db, not reaching an extent below −18 db; therefore, the signal received by the other output port of the signal distributor 1 is not in a good condition and results in signal distortion and signal fading. Thus, if the signal distributor 1 is employed for transmission of image signals, the images will be unclear and vague.

SUMMARY OF THE INVENTION

The objective of the invention is to offer an impedance matching wave filter, having an original filter connected in parallel with a match circuit which can be modulated to produce impedance matching with the original filter, able to better the condition of return loss and lower the phenomenon of signal fading and signal distortion.

BRIEF DESCRIPTION OF DRAWINGS

This invention will be better understood by referring to the accompanying drawings, wherein.

DETAILED DESCRIPTION OF THE PREFERRED EMBODIMENT

Figure 6:
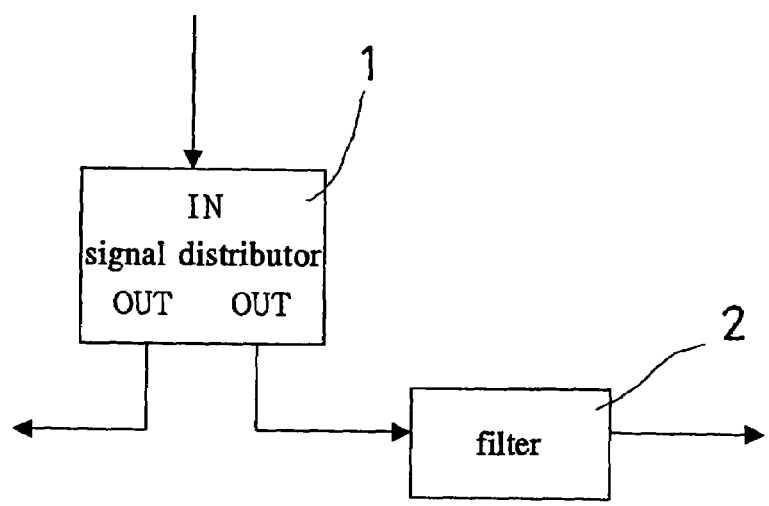
FIG. 6 is a block diagram of the circuit of a conventional wave filter.
Figure 1:
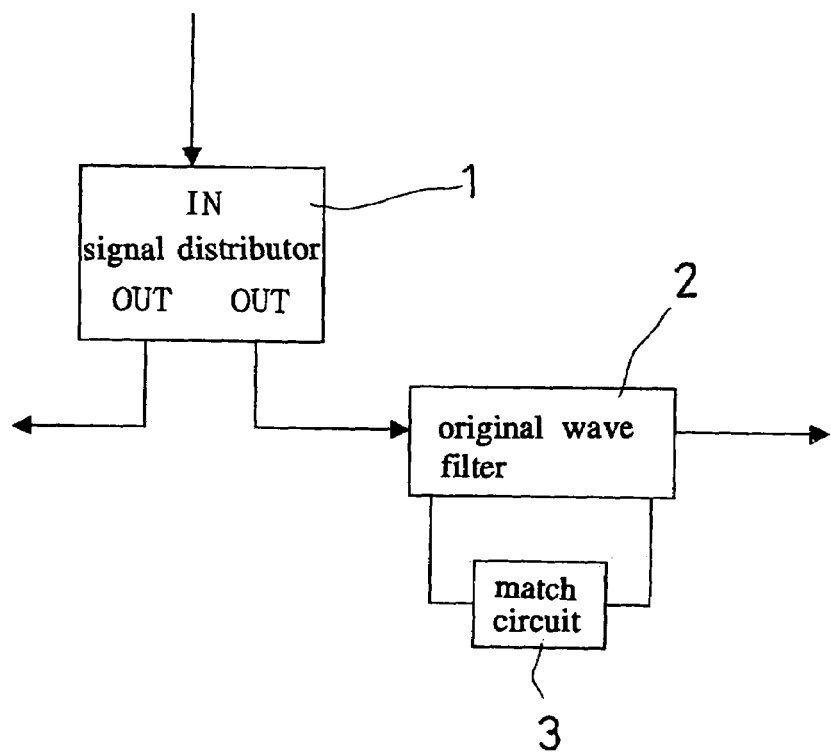
FIG. 1 is a block diagram of the circuit of an impedance matching wave filter in the preset invention.
Figure 2:
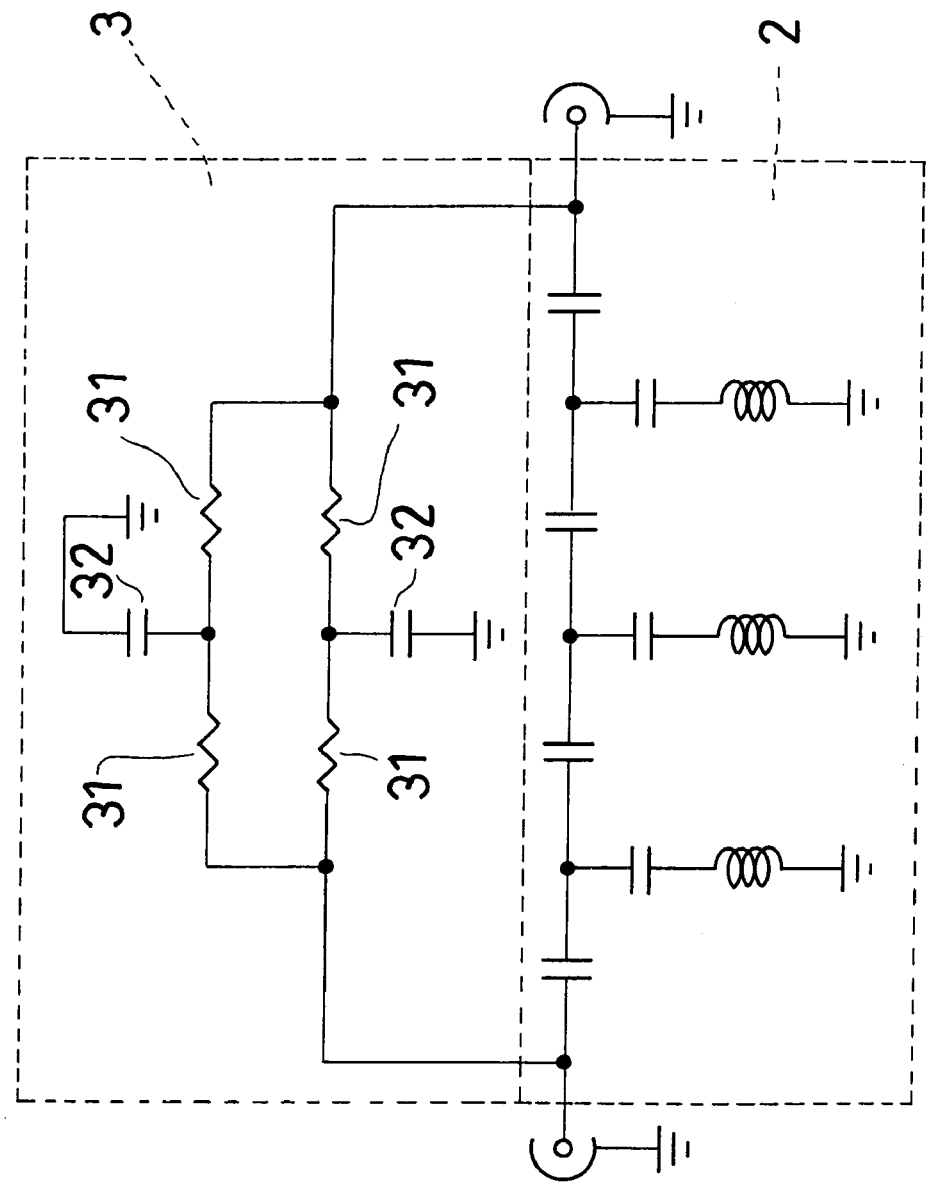
FIG. 2 is a circuit diagram of a first preferred embodiment of the impedance matching wave filter in the present invention.

A first preferred embodiment of an impedance matching wave filter in the present invention, as shown in FIGS. 1 and 2, includes an original wave filter 2 and a match circuit 3. The match circuit 3 could be a RC circuit connected in a bridge mode with the input terminal and the output terminal of the original wave filter 2 to produce impedance matching with the original wave filter 2 by modulating the resistance value or the capacitor value of the RC circuit.

Specifically, as shown in FIG. 2, the match circuit 3 is connected in parallel with the input terminal and output terminal of the original wave filter 2 by two sets (RC circuits) of series resistors 31 and capacitors 32. These sets of series resistors 31 are connected in parallel each to the other. Each of the capacitors 32 has one terminal coupled between the series resistors 31 of the respective set thereof while another terminal of the capacitors 32 is grounded. This arrangement forms the RC circuit of the match circuit 3 connected in a bridge mode with the input and output terminals of the original wave filter 2. The resistance value (R) or capacitor value (C) of the RC circuit may be varied to produce impedance match with the original wave filter 2.

A formula is: capacitor value $(C)=1/(2\pi f Xc)$. Xc represents capacitor impedance and f represents frequency value so $Xc=1/(2\pi f C)$. For instance, if frequency value (f) is set to be 85 MHz ($85 \times 10^6$ Hz) and C is set to be 33P ($33 \times 10^{-12}$), then $Xc=1/(2 \times 3.1416 \times 85 \times 10^6 \times 33 \times 10^{-12}) \approx 56.7$ Ω (ohm). Therefore, changing the capacitor value (C) is equivalent to changing the impedance value (Xc). By the same principle, when the impedance value preset is known and the frequency is to be changed, apply the formula: $f=1/(2\pi RC)$. For instance, if a virtual impedance is set to be 56.7 Ω, then $f=1/(2 \times 3.1416 \times 56.7 \times 33 \times 10^{-12})=85$ MHz. Therefore, after the resistance value (R) is fixed and a capacitor value (C) is modulated, the frequency value (f) can be altered. Relatively, after the capacitor value (C) is fixed and the resistance value (R) is modulated, the frequency value (f) can be altered, too. The resistance value (R) and the capacitor value (C) can be modulated in accordance with actual operation; however, as described in "Description of the Prior Art", an RF network analyzer can be employed to detect the waveform of the degree of the evenness and the return loss of the pass band of the output terminal of the wave filter 2, no matter what the modulation may be. If the degree of the evenness is excellent and the return loss is below −18 db, it shows that the filtering effect of the wave filter 2 is excellent. In this preferred embodiment, the frequency is set to be 85 MHz, but it could be set to be 65 MHz or 100 MHz or the like, and relatively the resistance value (R) and capacitor value (C) will alter together with the frequency changed. Actually, the resistance value (R) and the capacitor value (C) are allowable to be modulated so long as the degree of the evenness of the pass band of the output terminal of the wave filter 2 is excellent and the return loss is below −18 db after detected by the RF network analyzer.

Figure 3:
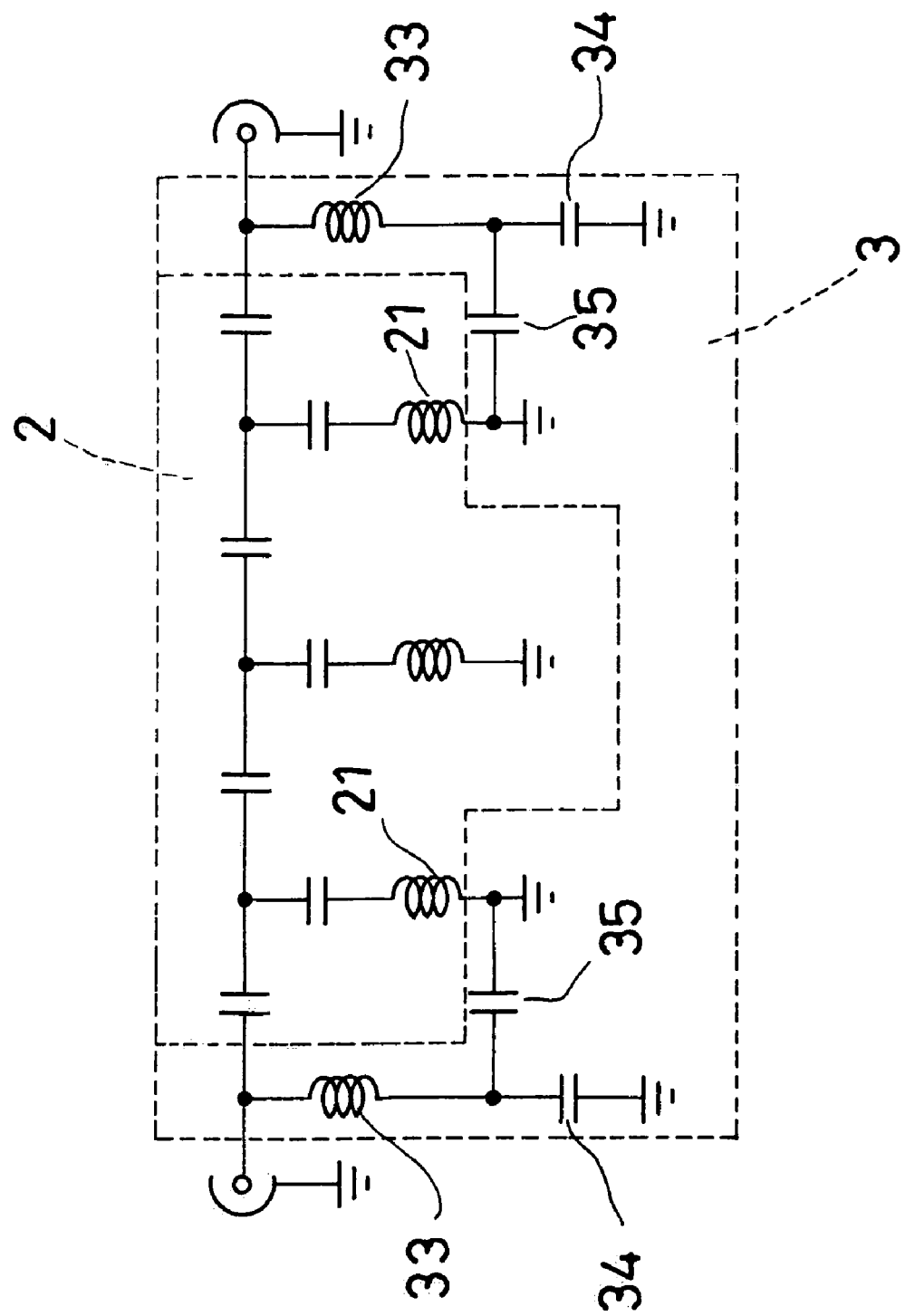
FIG. 3 is a circuit diagram of a second preferred embodiment of the impedance matching wave filter in the present invention.
Figure 4:
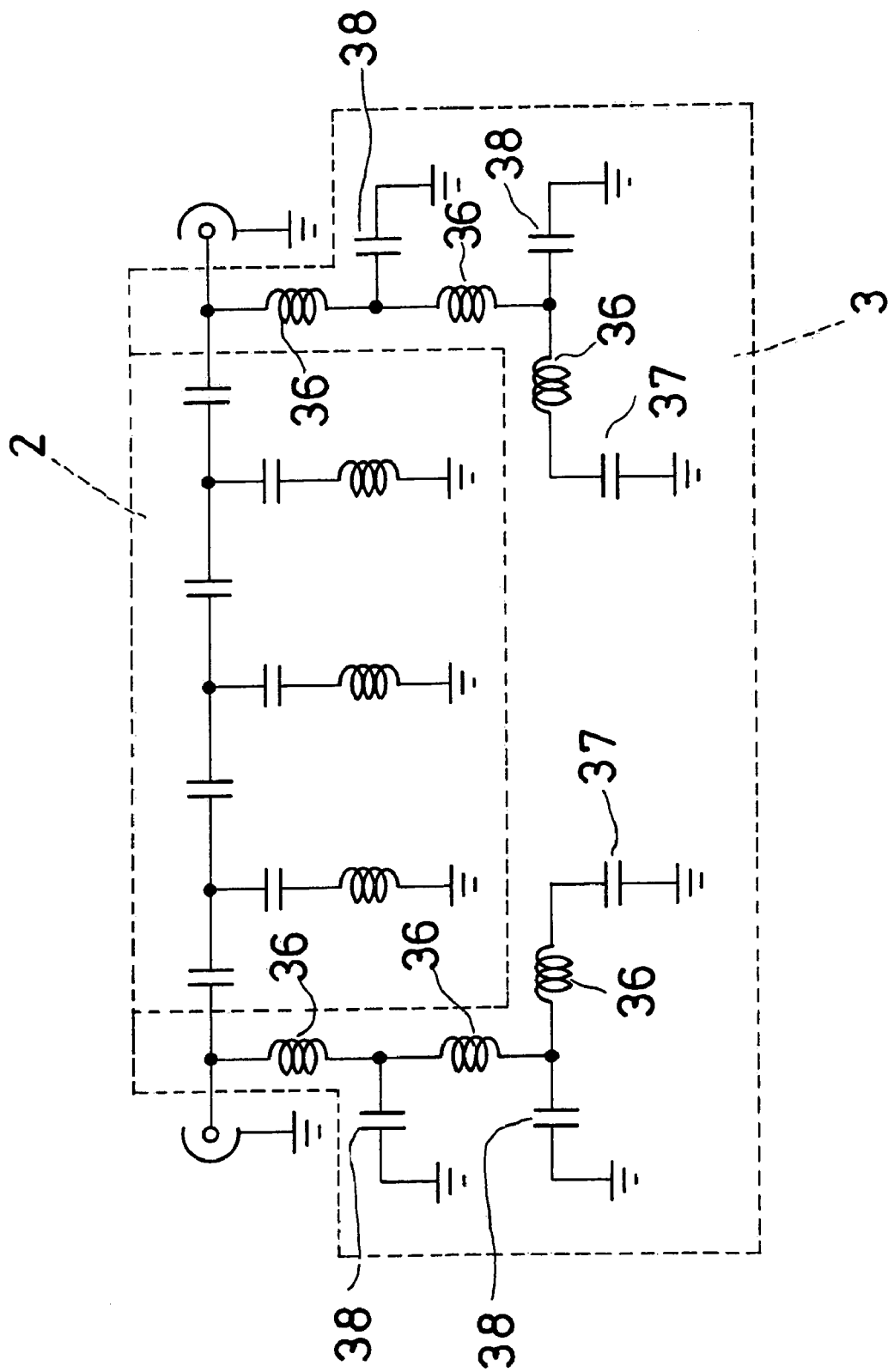
FIG. 4 is a circuit diagram of a third preferred embodiment of the impedance matching wave filter in the present invention.

A second and a third preferred embodiments of an impedance matching wave filter in the present invention, as shown in FIGS. 3 and 4, have symmetrical LC resonance circuits, serving as match circuits 3, respectively and are symmetrically coupled in parallel with the input terminal and output terminal of an original wave filter 2 so as to produce impedance matching with the original wave filter 2 by adjusting the inductance value and the capacitor value of the resonance circuit.

Specifically, as shown in FIG. 3, each of the output and input terminals of the original wave filter 2 is coupled to first terminals of inductors 33, while the second terminals of the inductors 33 are connected to respective first capacitors 34. Each capacitor 34 has a second end thereof grounded. A capacitor terminal 35 is coupled between the "ground" terminal of the inductor 21 of the original wave filter 2 and the first terminal of the capacitor 34.

As shown in FIG. 4, illustrating a further alternative embodiment of the present invention, each of the input and output terminals of the wave filter 2 is connected to three inductors 36 coupled each to the other in series, and a first terminal of a capacitor 37. The other terminal of the capacitor 37 is grounded. A capacitor 38 is coupled by one terminal thereof between each two inductors 36. Another terminal of the capacitors 38 is a "ground" terminal.

The formula of high-frequency resonance principle is: frequency (f)=$1/(2 \sqrt{LC})$, inductance (L)=$1/(4p^2 f^2 C)$, capacitor (C)=$1/(4p^2 f^2 L)$. Like the RC circuit of the first preferred embodiment shown in FIG. 2, if (c) is 33P and the frequency is 85 MHz, then L=$1/[4\times 3.1416^2 \times (85\times 10^6)^2 \times 33 \times 10^{-12}]$=0.1 pH(0.1×10$^{-6}$H). Relatively, if the inductance value (L) and the capacitor value (C) are known, the frequency (F) can be known and hence: in case the inductance value (L) is modulated, the frequency point or the resonance point can also be modulated. Therefore, the extent of the inductance L is decided by the range of the frequency needed. If the range of frequency preset is too small, simply modulate the inductance value (inductance amount) and then modulate the inductance impedance according to the formula of the inductance impedance: $X_L$=2 pfL, L=$X_L/(2 \text{ pf})$ so as to attain impedance matching. When a required frequency point (such as 85 MH$_2$) is set, the value of the inductance (L) and the capacitor (C) as well as the value of the inductance impedance and the capacitor impedance can be known, able to attain an effect of impedance matching. In addition, as described in the first preferred embodiment, a RF network analyzer is employed for detecting the degree of the evenness and the return loss of the pass band of the output terminal of the wave filter 2. If the degree of the evenness is excellent and the return loss is below −18 db, it shows that the filtering effect of the wave filter 2 is excellent and that the modulated value of the inductance (L) and the capacitor (C) as well as the value of the inductance resistance and the capacitor resistance is all allowable.

Figure 5:
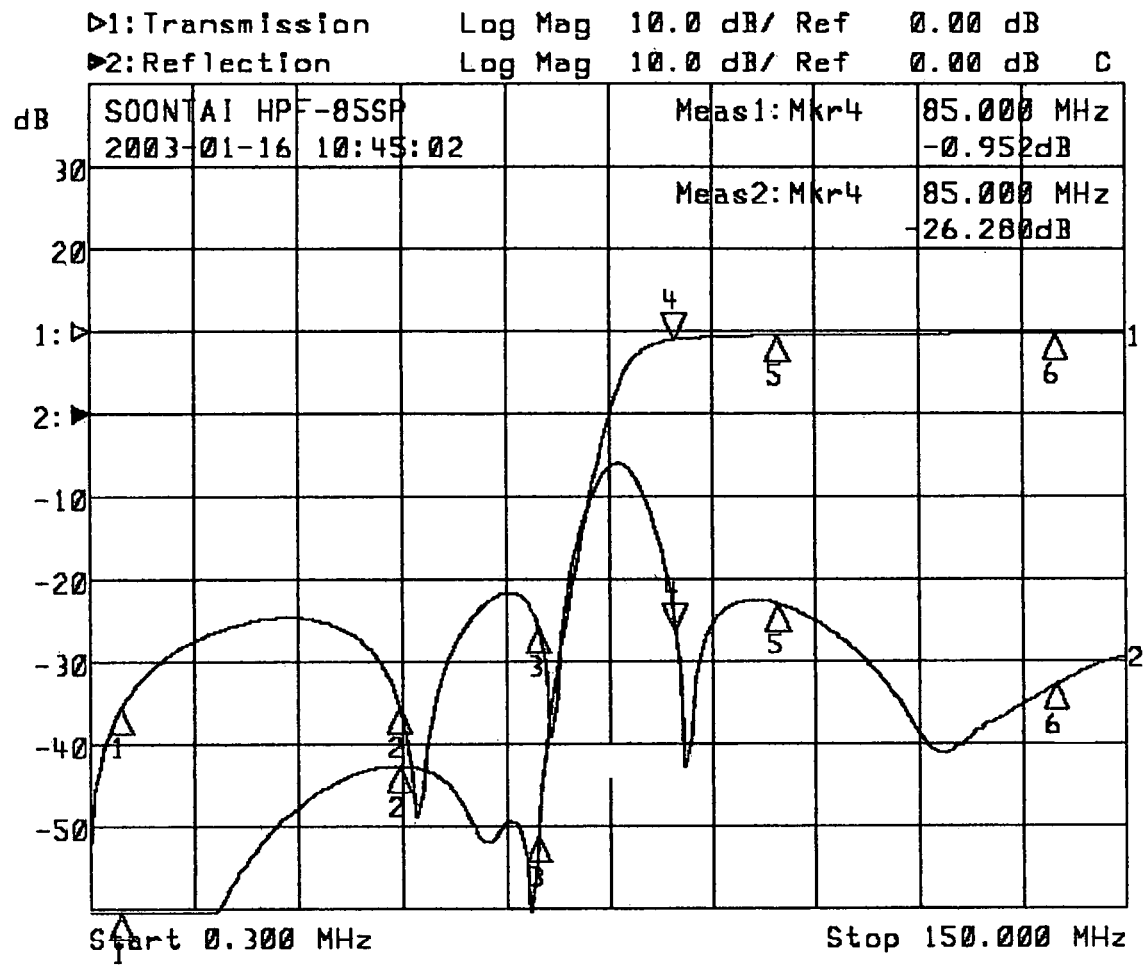
FIG. 5 is a waveform diagram of the preferred embodiment of the impedance matching wave filter in the present invention.
Figure 7:
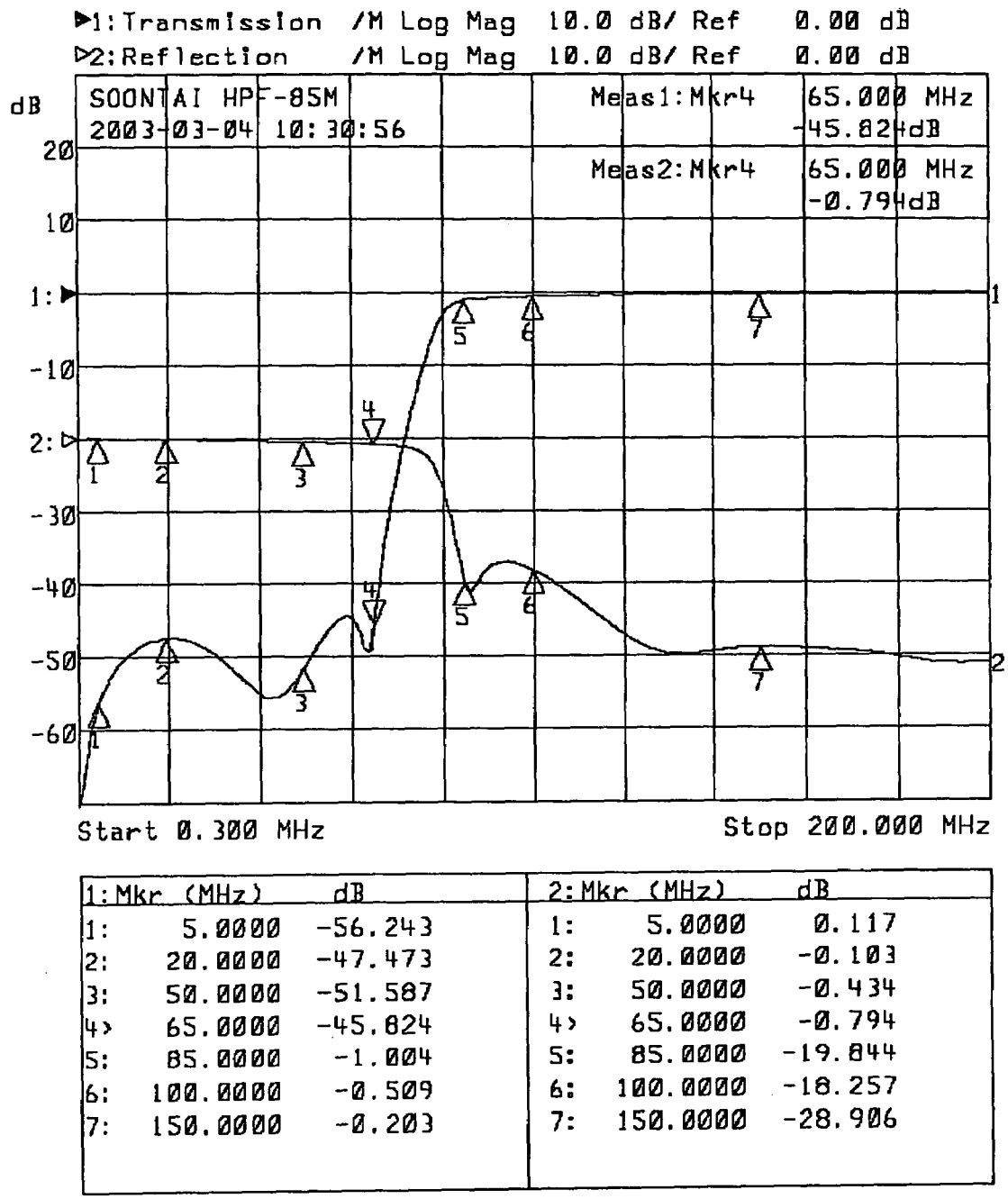
FIG. 7 is a waveform diagram of a preferred embodiment of the conventional wave filter.

The match circuit 3 is connected in parallel with the original filter 2, as shown in FIG. 1, and FIG. 5 is a waveform diagram showing the degree of the evenness and the return loss of the pass band of the wave filter 2, detected by the RF network analyzer after the match circuit 3 is modulated. In the waveform diagram of FIG. 5, it is obvious that the stop wave band of signal of Measure 1 is positioned below marks 1 to 3 [Δ1~Δ3], that is, the wave band frequency is below 65 MHz. In comparison with measure 1, the wave band of return loss from mark 1 to mark 3 (Δ1~Δ3) of Measure 2, corresponding to the stop wave band of Measure 1, is positioned below −18 db. Specifically Δ1 is −35.411 db, Δ2 is −35.481 db and Δ3 is −25.671 db, showing that the return loss is in an excellent condition.

Having a match circuit 3 connected in parallel with an original wave filter 2 and having the match circuit 3 modulated to produce impedance matching with the original wave filter 2, this invention has the following advantages.

1. It is able to better the condition of the return loss of the output signal of the wave filter 2 and lower the phenomenon of signal fading and signal distortion.

2. When coupled with one of the two output ports of a signal distributor 1 for use, the impedance matching wave filter will never affect the impedance matching of the other output port of the signal distributor 1, able to prevent signals from fading and distorting.

While the preferred embodiments of the invention have been described above, it will be recognized and understood that various modifications may be made therein and the appended claims are intended to cover all such modifications that may fall within the spirit and scope of the invention.

I claim:

1. An impedance matching wave filter, comprising a wave filter and a match circuit connected in parallel with said wave filter, said match circuit including an RC circuit connected in a bridge mode with the input terminal and the output terminal of said wave filter, the resistance value or the capacitor value of said RC circuit being varied to produce impedance matching with said wave filter, wherein said RC circuit of said match circuit includes a first RC set and a second RC set coupled in parallel each to the other, each of said RC sets including a pair of serially connected resistors and a capacitor, a first terminal of said capacitor being coupled between said resistors, and a second terminal of said capacitor being connected to ground.

2. An impedance matching wave filter, comprising a wave filter and a match circuit connected in parallel with said wave filter, said match circuit including symmetrical LC resonance circuits respectively and symmetrically connected in parallel with the input terminal and the output terminal of said wave filter, each of said symmetrical LC resonance circuits being varied to produce impedance matching with said wave filter, wherein each of said symmetrical LC resonance circuits includes an inductor, a first capacitor and a second capacitor, said inductor being coupled by a first terminal thereof directly to a respective one of said input and output terminals of the wave filter, said first capacitor being coupled by a first terminal thereof to a second terminal of said inductor and a first terminal of said second capacitor, a second terminal of said first capacitor and a second terminal of said second capacitor being connected to the ground terminal of an inductor of said wave filter.

3. An impedance matching wave filter, comprising a wave filter and a match circuit connected in parallel with said wave filter, said match circuit including a pair of symmetrical LC resonance circuits each connected in parallel to a respective one of the input and output terminals of said wave filter, each said LC resonance circuit being adjusted to result in impedance matching with said wave filter, wherein each of said symmetrical LC resonance circuits includes first, second and third inductors, and first, second and third capacitors, said first inductor being connected by a first terminal thereof to said respective one of said input and output terminals of said wave filter and by a second terminal thereof to a first terminal of said second inductor and a first terminal of said first capacitor, said second inductor being coupled by a second terminal thereof to a first terminal of said third inductor and a first terminal of said second capacitor, said third capacitor being connected by a first terminal thereof to said second terminal of said third inductor, and second terminals of said first, second and third capacitors being connected to ground.

* * * * *